United States Patent
Im et al.

(10) Patent No.: US 9,423,044 B2
(45) Date of Patent: Aug. 23, 2016

(54) PIEZOELECTRIC VALVE AND METHOD OF MANUFACTURING THE SAME

(71) Applicant: INZI CONTROLS CO. LTD., Siheung-si, Gyeonggi-do (KR)

(72) Inventors: Jong Dae Im, Anyang-si (KR); Sang Hyoun Park, Siheung-si (KR); Taek Seung Kim, Seoul (KR); Kwang Bok Park, Siheung-si (KR)

(73) Assignee: INZI CONTROLS CO. LTD., Siheung-si (KR)

( * ) Notice: Subject to any disclaimer, the term of this patent is extended or adjusted under 35 U.S.C. 154(b) by 0 days.

(21) Appl. No.: 14/433,706

(22) PCT Filed: Nov. 28, 2013

(86) PCT No.: PCT/KR2013/010887
§ 371 (c)(1),
(2) Date: Apr. 6, 2015

(87) PCT Pub. No.: WO2014/084620
PCT Pub. Date: Jun. 5, 2014

(65) Prior Publication Data
US 2015/0276081 A1      Oct. 1, 2015

(30) Foreign Application Priority Data
Nov. 29, 2012    (KR) .................. 10-2012-0136687

(51) Int. Cl.
*F16K 31/00* (2006.01)
*H01L 41/09* (2006.01)

(52) U.S. Cl.
CPC ............. *F16K 31/005* (2013.01); *F16K 31/006* (2013.01); *H01L 41/094* (2013.01); *Y10T 137/86622* (2015.04)

(58) Field of Classification Search
CPC ............... Y10T 137/86622; Y10T 137/86847; F16K 31/004; F16K 31/005; F16K 99/0048; H01L 41/053; H01L 9/0519; H01L 9/0514; H01L 9/0542; H01L 9/0547
See application file for complete search history.

(56) References Cited

U.S. PATENT DOCUMENTS 4,492,360 A * 1/1985 Lee, II .................. F16K 31/006
 251/129.06
4,617,952 A * 10/1986 Fujiwara ................. F15B 5/003
 137/596.17

(Continued)

FOREIGN PATENT DOCUMENTS

JP        62-181768 U    11/1987
JP        63-026476 A    2/1988

(Continued)

OTHER PUBLICATIONS

International Searching Authority, International Search Report for PCT/KR2013/010887 dated Mar. 13, 2014 [PCT/ISA/210].

*Primary Examiner* — Matthew W Jellett
(74) *Attorney, Agent, or Firm* — Sughrue Mion, PLLC

(57) ABSTRACT

A piezoelectric valve operated by voltage and a method of manufacturing the piezoelectric valve. The piezoelectric valve includes: a valve body; a valve unit; a plate-shaped piezoelectric element; an insulation stick for insulating the piezoelectric element; an adjustment bolt attached to the valve body with the insulation stick fitted over the bolt; an elastic body elastically supporting the insulation stick; an adjustment nut tightened to the adjustment bolt for moving along the bolt by rotation of the bolt so as to displace the insulation stick and an end of the piezoelectric element by pushing the insulation stick; and an adjuster for moving the adjustment nut along the adjustment bolt by a pivoting of the adjustment bolt, thereby adjusting a pushing force of the insulation stick. The piezoelectric valve can reduce economic loss in manufactured valves because the valve flow rate can be adjusted even after assembling the valve body.

4 Claims, 6 Drawing Sheets

(56) References Cited

U.S. PATENT DOCUMENTS

| | | | | |
|---|---|---|---|---|
| 4,771,204 A | * | 9/1988 | Siegal | F16K 7/14 137/831 |
| 5,669,416 A | * | 9/1997 | Nusche | F15C 3/08 137/625.44 |
| 5,779,218 A | * | 7/1998 | Kowanz | F16K 31/006 257/129.06 |
| 6,561,436 B1 | * | 5/2003 | Boecking | F02M 47/046 123/498 |
| 7,205,704 B2 | * | 4/2007 | Audren | H02N 2/043 310/328 |
| 7,322,376 B2 | * | 1/2008 | Frisch | F16K 31/006 137/625.5 |
| 8,220,491 B2 | * | 7/2012 | Schaible | F16K 31/006 137/625.44 |
| 8,631,825 B2 | * | 1/2014 | Lee | F16K 31/006 137/625.44 |

FOREIGN PATENT DOCUMENTS

| | | |
|---|---|---|
| KR | 10-0991065 B1 | 10/2010 |
| KR | 10-1155116 B | 6/2012 |

* cited by examiner

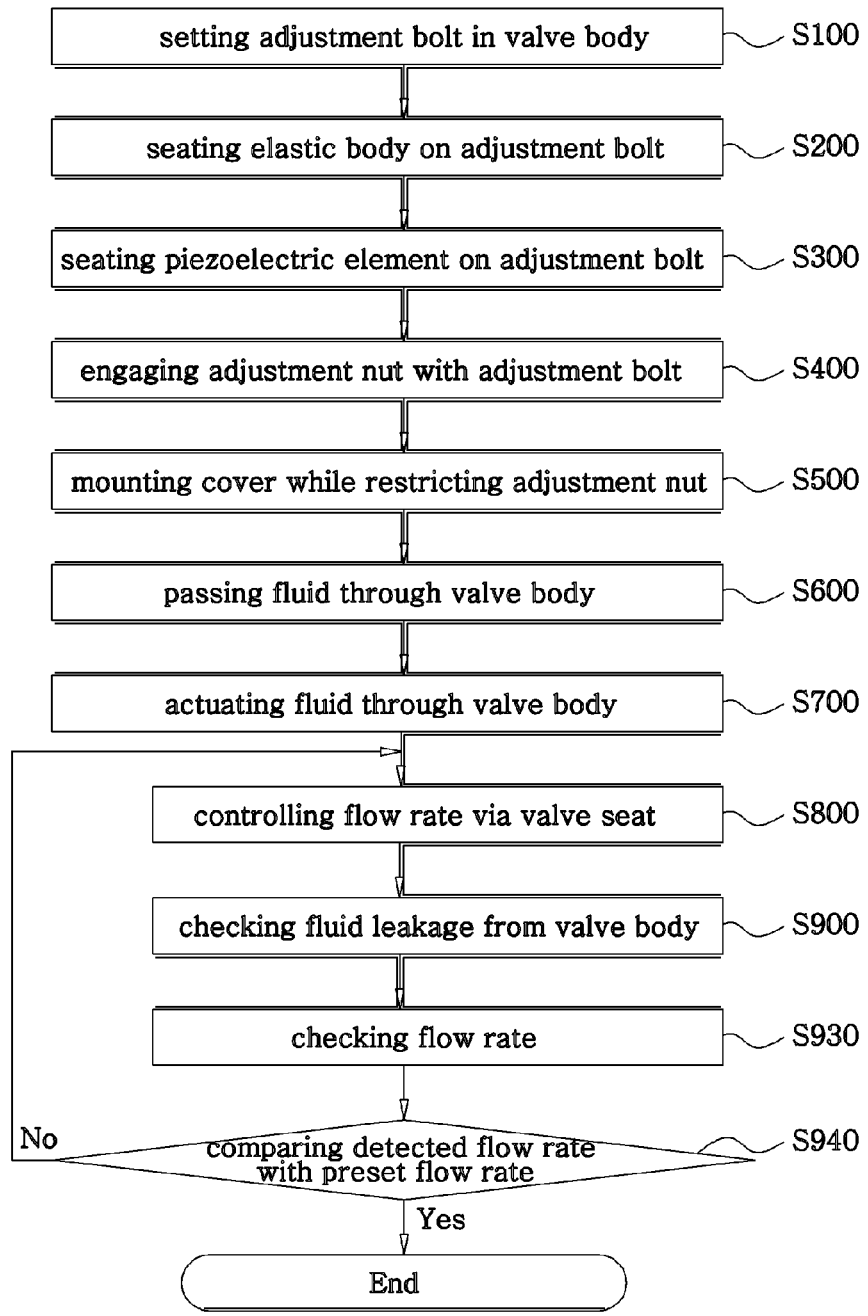

US 9,423,044 B2

PIEZOELECTRIC VALVE AND METHOD OF MANUFACTURING THE SAME

CROSS-REFERENCE TO RELATED APPLICATIONS

This application is a National Stage of International Application No. PCT/KR2013/010887 filed Nov. 28, 2013, claiming priority based on Korean Patent Application No. 10-2012-0136687 filed Nov. 29, 2012, the contents of all of which are incorporated herein by reference in their entirety.

TECHNICAL FIELD

The present invention generally relates to a piezoelectric valve and a method of manufacturing the piezoelectric valve. More particularly, the present invention relates to a piezoelectric valve and a method of manufacturing the piezoelectric valve, in which the piezoelectric valve controls the flow of a fluid using a piezoelectric element bending by voltage.

BACKGROUND ART

In general, a piezoelectric valve is a device that opens or closes a fluid line using a piezoelectric element bending by voltage. In recent years, the piezoelectric valve has been installed in cars and controls the flow of fuel supplied to an engine of the car or controls the flow of air supplied to an airbag mounted in the back of a seat of the car.

FIG. 1 is a sectional view illustrating the construction of a conventional piezoelectric valve. As shown in the drawing, the conventional piezoelectric valve is configured such that a first end of a plate-shaped piezoelectric element 7 installed in a casing 2 bends by voltage applied to the piezoelectric element 7 and opens or closes valve seats 4A and 5A of the casing 2. Here, the piezoelectric valve may be configured to open or close the opposite valve seats 4A and 5A of the casing 2 as shown in the drawing, or may be configured to open or close one valve seat 4A, 5A unlike the embodiment shown in the drawing.

The above-mentioned conventional piezoelectric valve may be configured in such a way that a second end of the piezoelectric element 7 is fastened to the casing 2 using a rubber plate 8, as shown in the drawing, or unlike the embodiment shown in the drawing, the second end of the piezoelectric element 7 may be fastened to the casing 2 using a hardener such as an epoxy resin.

However, in the conventional piezoelectric valve, the second end of the piezoelectric element 7 is fastened to the casing 2 using the rubber plate 8 or using the hardener such as the epoxy resin, so the conventional piezoelectric valve is problematic in that it is difficult to fasten the piezoelectric element 7 to the casing 2. Further, due to the piezoelectric element fastening method using the rubber plate 8 or using the hardener, the fastened position of the piezoelectric element 7 is not adjustable, so the piezoelectric element 7 cannot control the flow rate of a fluid flowing into the valve seats 4A and 5A.

As a related art technology that can overcome the above-mentioned problems, a piezoelectric valve was proposed in Korean Patent No. 10-1155116 owned by the inventor of this invention.

As shown in FIG. 2, in the above-mentioned related art technology, a plate-shaped piezoelectric element 80 that opens or closes a valve unit 60 provided in a valve body 50 is fastened by a fastener in such a way that the fastened position of the piezoelectric element 80 is adjustable, so the flow rate of a fluid passing the valve unit 60 can be controlled by adjusting the fastened position of the piezoelectric element 80 using the fastener.

Described in detail, in the piezoelectric valve of the related art technology, the fastener is configured such that an insulation stick 91 is integrally fastened to the second end of the piezoelectric element 80 and is fitted over an adjustment bolt 93 with an elastic body 95 elastically supporting the insulation stick 91. Further, an adjustment nut 97 is engaged with the adjustment bolt 93. Here, to control the flow rate of a fluid passing the valve unit 60 of the piezoelectric valve, it is required to rotate the adjustment nut 97 so that the adjustment nut 97 compresses the insulation stick 91 and moves the second end of the piezoelectric element 80.

In other words, in the piezoelectric valve of the related art technology, the head of the adjustment bolt 93 is immovably embedded in the casing 52 while being covered with a cover 56 constituting the valve body 50, as shown in FIG. 2, so, to control the flow rate of a fluid passing the valve unit 60, it is required to rotate the adjustment nut 97 instead of rotating the adjustment bolt 93.

However, in the piezoelectric valve of the related art technology, the adjustment nut 97 is covered with another cover 54, so it is impossible to rotate the adjustment nut 97 after mounting the cover 54 to the casing 52. Accordingly, after mounting the cover 54 to the casing 52, it is impossible to rotate the adjustment nut 97 or to control the flow rate of a fluid passing the valve unit 60.

Described in detail, during a process of manufacturing the piezoelectric valve of the related art technology, a user controls the flow rate of a fluid passing the valve unit 60 by rotating the adjustment nut 97 after mounting both the valve unit 60 and the piezoelectric element 80 in the casing 52. After controlling the flow rate of the fluid, the two covers 54 and 56 are welded to their locations on the casing 52, so the manufacturing of the piezoelectric valve is finished. After manufacturing the piezoelectric valve, the manufactured valve is subjected to both an electric leakage test and a flow rate test for quality control.

However, the piezoelectric valve of the related art technology is problematic in that a flow deviation may be generated in the valve due to assembly tolerances of respective parts of the valve, for example, the covers 54 and 56 welded to the casing with different junction depths. Here, although a flow deviation is generated in the piezoelectric valve as described above, it is impossible to control the flow rate of the valve again because the adjustment nut 97 and the adjustment bolt 93 are covered with the respective covers 54 and 56, so the manufactured valve should be discarded resulting in large economic loss.

DISCLOSURE

Technical Problem

Accordingly, the present invention has been made keeping in mind the above problems occurring in the related art, and the present invention is intended to propose a piezoelectric valve and a method of manufacturing the piezoelectric valve, in which an adjustment nut is held in such a way that the nut is moved by a rotation of an adjustment bolt without being rotated, so it is possible to adjust the flow rate of the piezoelectric valve even after assembling a valve body in addition to before assembling the valve body.

Technical Solution

In order to achieve the above object, according to one aspect of the present invention, there is provided a piezoelectric valve openable by voltage, the piezoelectric valve including: a valve body including: at least one port through which a fluid flows, an internal space communicating with the port, and at least one valve seat through which the fluid flowing through the port flows; a valve unit opening or closing the valve seat of the valve body; a plate-shaped piezoelectric element horizontally installed in the internal space of the valve body, with the valve unit mounted to a first end of the piezoelectric element; an insulation stick integrated with a second end of the piezoelectric element, and protecting the second end of the piezoelectric element in an insulating state; an adjustment bolt rotatably held in the valve body, with the insulation stick fitted over the adjustment bolt; an elastic body elastically supporting the insulation stick fitted over the adjustment bolt in such a way that the insulation stick is moved along a length of the adjustment bolt; an adjustment nut engaged with the adjustment bolt at a location opposite to the elastic body, the adjustment nut compressing the insulation stick while being moved along the length of the adjustment bolt by a pivot rotation of the adjustment bolt, thereby moving both the insulation stick and the second end of the piezoelectric element along the length of the adjustment bolt; and an adjuster holding the adjustment nut in the valve body in such a way that the adjustment nut is movable while being prevented from rotating, the adjuster moving the adjustment nut in response to the pivot rotation of the adjustment bolt and controlling a compression force acting on the insulation stick by the adjustment nut.

Here, the adjuster may include: a nut holder formed in the valve body and having a cap-shaped structure, with a close contact surface formed on an inner circumferential surface of the nut holder and coming into close contact with an outer circumferential surface of the adjustment nut, thereby preventing the adjustment nut from rotating, and with a space defined in the nut holder and having a depth greater than a height of the adjustment nut, thereby forming a moving space for allowing a movement of the adjustment nut.

In another aspect of the present invention, there is provided a method of manufacturing a piezoelectric valve, the method including: an adjustment bolt setting step of setting an adjustment bolt in a valve body that includes at least one port through which a fluid flows, an internal space communicating with the port, and at least one valve seat through which the fluid flowing through the port flows, by vertically inserting a threaded shaft of the adjustment bolt into the valve body such that the threaded shaft of the adjustment bolt is placed in the internal space of the valve body; an elastic body seating step of seating an elastic body on the threaded shaft of the adjustment bolt set in the valve body; a piezoelectric element seating step of seating a piezoelectric element that is combined with a valve unit at a first end thereof and is combined with an insulation stick at a second end thereof, on the elastic body by fitting the second end of the piezoelectric element over the threaded shaft of the adjustment bolt; an adjustment nut engaging step of engaging an adjustment nut with the threaded shaft of the adjustment bolt, thereby assembling the adjustment nut with the adjustment bolt; a cover mounting step of mounting a cover having a nut holder that holds the adjustment nut in such a way that the adjustment nut is movable while being prevented from rotating, to the valve body so that the cover tightly closes the internal space of the valve body and prevents a rotation of the adjustment nut; a fluid passing step of passing the fluid through the internal space of the valve body by supplying or discharging the fluid into or from the valve body via the port; a piezoelectric element actuating step of causing the first end of the piezoelectric element combined with the valve unit to bend by supplying electricity to the piezoelectric element, so that the valve unit opens or closes the valve seat of the valve body; a flow rate control step of controlling a flow rate of the fluid flowing through the valve seat by moving the adjustment nut along the threaded shaft of the adjustment bolt according to an opening ratio of the valve seat formed by the valve unit; and a fluid leakage test step of determining whether the fluid leaks from the internal space of the valve body while supplying the fluid into the internal space.

Here, in the flow rate control step, a head of the adjustment bolt may be rotated so that the adjustment nut is moved along the threaded shaft of the adjustment bolt, thereby moving a fastened position of the second end of the piezoelectric element held by the threaded shaft of the adjustment bolt, and adjusting a position of the valve unit combined with the first end of the piezoelectric element.

Further, the method of manufacturing the piezoelectric valve may further include: a flow rate test step of determining the flow rate of the fluid flowing through the valve seat while passing the fluid through the valve body again by supplying or discharging the fluid into or from the internal space of the valve body and while actuating the piezoelectric element when it is determined that the fluid leaks from the internal space of the valve body at the fluid leakage test step; and a flow rate comparing step of comparing the flow rate of the fluid flowing through the valve seat determined at the flow rate test step with a preset reference flow rate, and of adjusting the flow rate again or ending a procedure according to a comparing result.

Advantageous Effects

The piezoelectric valve and the method of manufacturing the piezoelectric valve according to the present invention is advantageous in that the adjustment nut is provided in the valve body with the adjuster preventing a rotation of the adjustment nut, and can control the compression force acting on the insulation stick by being moved by a rotation of the adjustment bolt, so the present invention can control the flow rate of a fluid in the piezoelectric valve by adjusting the fastened position of the piezoelectric element even after assembling the valve body, and the present invention can remarkably reduce generation of imperfection in manufactured valves.

More specifically, in the present invention, the nut holder is provided in the valve body in such a way that the nut holder is in close contact with the outer circumferential surface of the adjustment nut and forms a moving space for allowing a movement of the adjustment nut, so the adjustment nut can stably compress the insulation stick and can adjust the fastened position of the piezoelectric element while being moved along the inside surface of the nut holder.

DESCRIPTION OF DRAWINGS

FIG. 6 is a view illustrating a method of manufacturing the piezoelectric valve according to the present invention.

BEST MODE

Reference will now be made in greater detail to an exemplary embodiment of the present invention, an example of which is illustrated in the accompanying drawings. In the following description, it is to be noted that, when the functions and configuration of conventional elements and the detailed description of elements related with the present invention may make the gist of the present invention unclear, a detailed description of those elements will be omitted.

Figure 1:
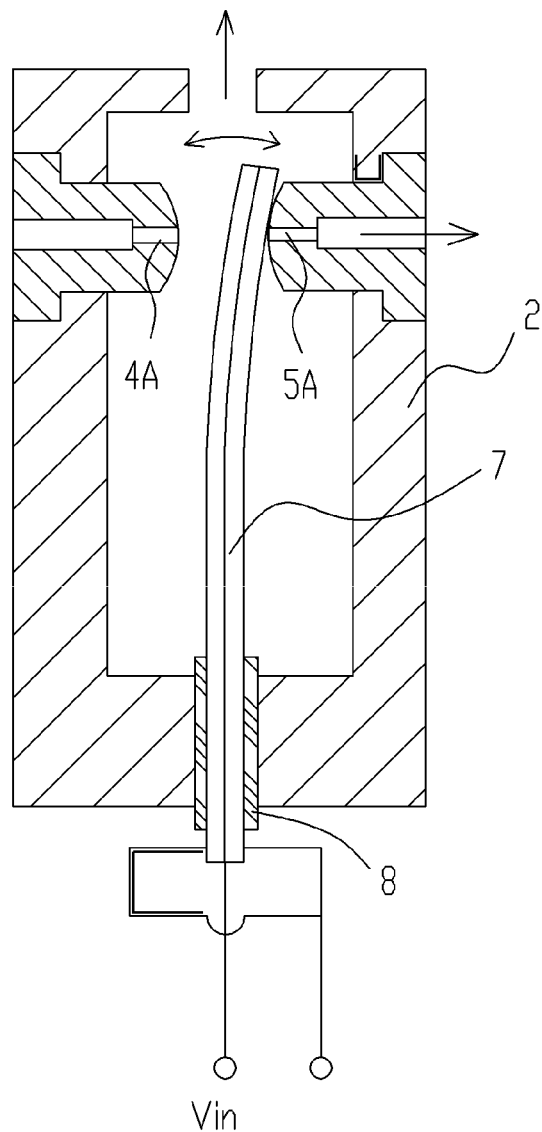
FIG. 1 is a longitudinal sectional view showing a conventional piezoelectric valve.
Figure 2:
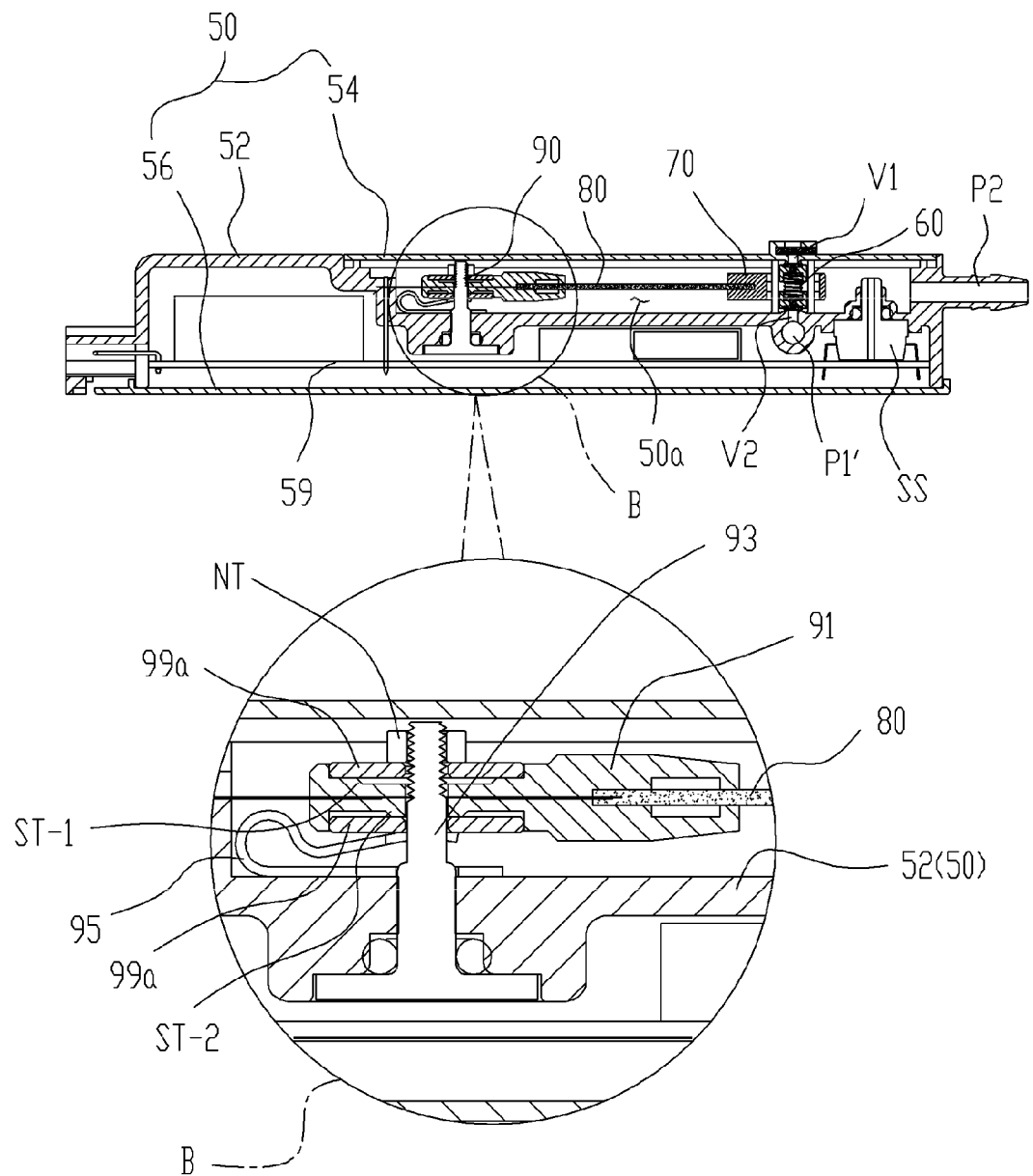
FIG. 2 is a longitudinal sectional view showing another conventional piezoelectric valve.
Figure 3:
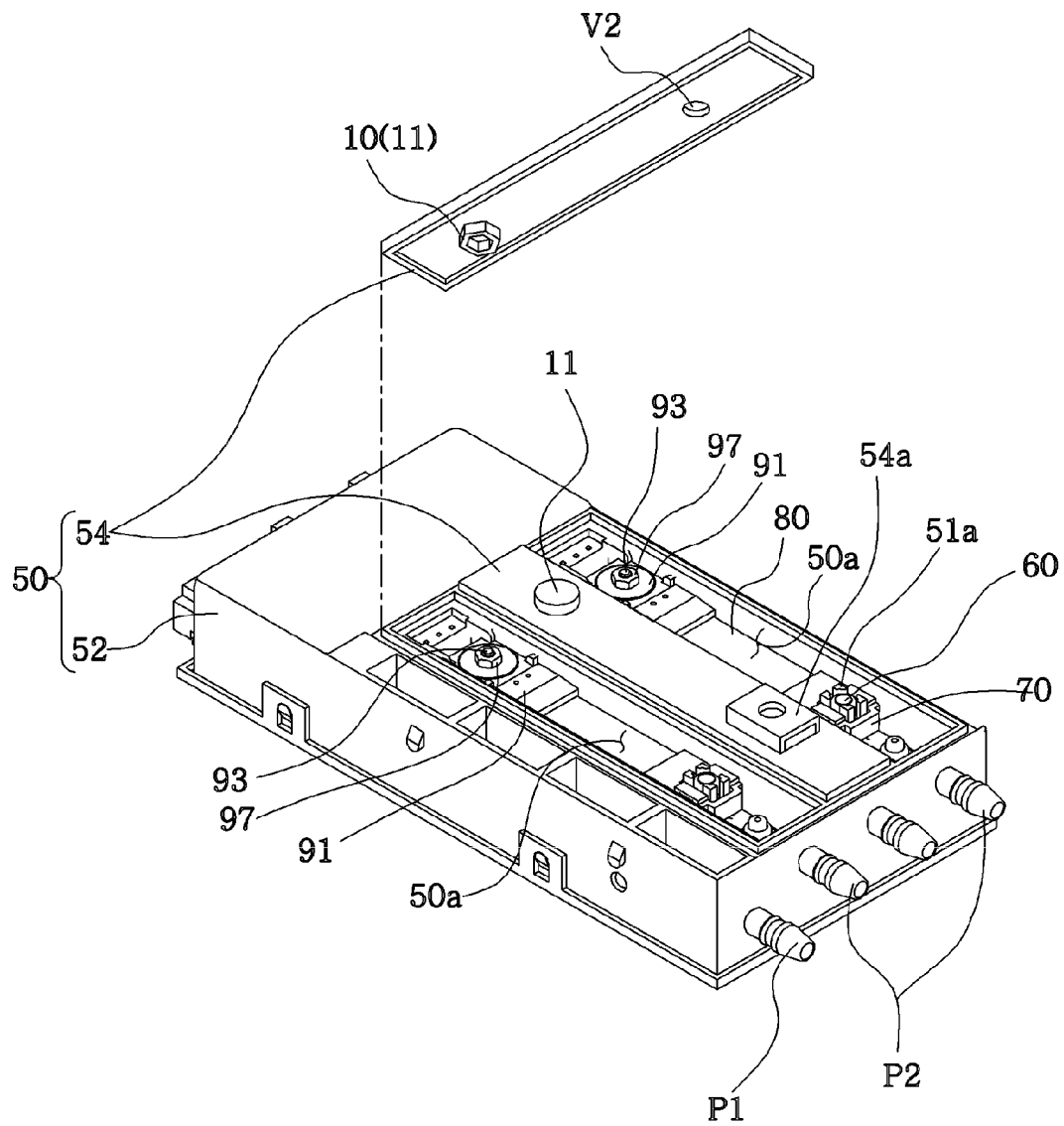
FIG. 3 is an exploded perspective view showing a piezoelectric valve according to the present invention.
Figure 4:
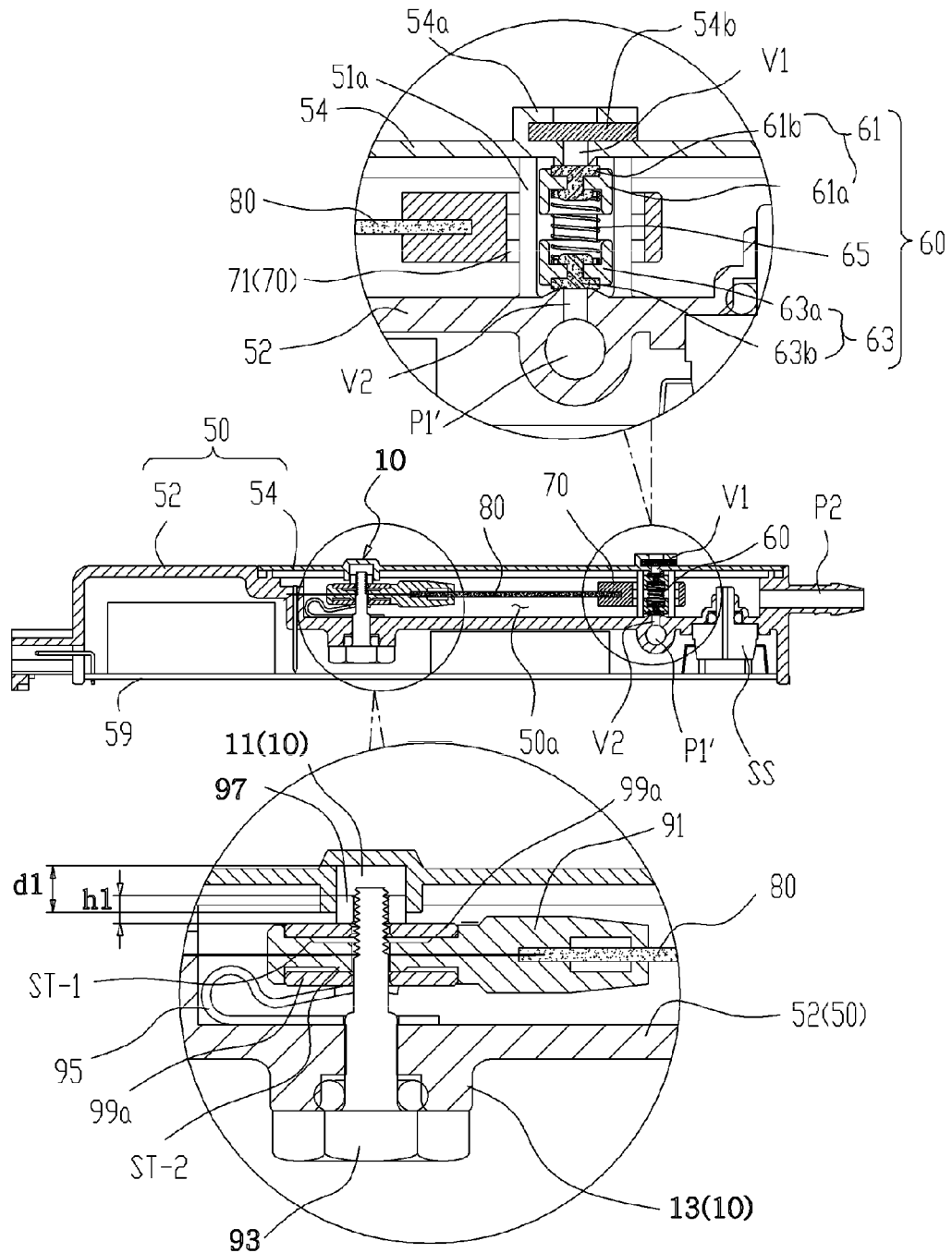
FIG. 4 is a longitudinal sectional view of the piezoelectric valve according to the present invention when seeing the piezoelectric valve from the front.

A piezoelectric valve according to the present invention includes: a valve body 50, a valve unit 60, a piezoelectric element 80, an insulation stick 91, an adjustment bolt 93, an elastic body 95, an adjustment nut 97, and an adjuster 10, as shown in FIGS. 3 and 4.

The valve body 50 may comprise a casing 52 and a cover 54, as shown in FIG. 3, for example.

As shown in FIG. 3, the casing 52 may include an internal space 50a and is open to a side, so the internal space 50a of the casing 52 is exposed to the outside. In the casing 52, the internal space 50a may be configured as a plurality of internal spaces, as shown in the drawing, or may be configured as a single internal space. When the internal space 50a is configured as a plurality of internal spaces, the internal spaces may be arranged in a parallel arrangement as shown in the drawing.

The casing 52 may be provided with a pump port P1 on a sidewall for introducing compressed air into the casing, and may be provided with a bidirectional port P2 on the sidewall for introducing or discharging air into or from the casing, as shown in FIG. 3. Here, the pump port P1 forms a fluid line through which compressed air pumped by a pump (not shown) flows into the casing. The bidirectional port P2 forms a fluid line through which the compressed air that has been introduced into the casing via the pump port P1 is supplied to an airbag (not shown) installed in the back of a seat or through which air is discharged from the airbag into the internal space 50a of the casing 52.

Here, as shown in FIG. 4, the internal space 50a communicates with the outside of the casing via a first valve seat V1 formed in the cover 54 that will be described later herein, and communicates with a port fluid line P1' via a second valve seat V2, in which the port fluid line P1' is connected to the pump port P1.

Further, a circuit board 59 may be mounted to the lower part of the casing 52, as shown in FIG. 4. The circuit board 59 may be covered with a lower cover (not shown) mounted to the lower part of the casing 52.

The cover 54 is mounted to the open side of the casing 52, and closes the internal space 50a of the casing, as shown in FIG. 3. The cover 54 is provided with both the first valve seat V1 and a pocket 54a, as shown in FIG. 4. Here, the first valve seat V1 communicates with the internal space 50a, so the compressed air is discharged from the internal space 50a to the outside of the casing. The pocket 54a is formed at a location corresponding to the valve unit 60, and communicates with the first valve seat V1. The pocket 54a is open to a side, and a sound absorbing material 54b, for example, sponge, is charged in the pocket 54a. The valve unit 60 will be described in detail later herein.

In other words, as shown in FIG. 4, in the valve body 50, compressed air that flows from the pump port P1 is introduced into the internal space 50a via both the port fluid line P1' and the second valve seat V2, and is supplied to the airbag (not shown) via the bidirectional port P2. Compressed air discharged from the airbag flows into the internal space 50a, and is discharged into the pocket 54a of the cover 54 via the first valve seat V1.

The valve unit 60 is a unit that opens or closes the valve seats V1 and V2 of the valve body 50. As shown in FIG. 3, the valve unit 60 is mounted in the internal space 50a of the casing 52 at a location near both the first and second valve seats V1 and V2. As shown in the drawings, the valve unit 60 is surrounded by a guide bar 51a that vertically stands inside a shift member 70. The shift member 70 will be described later herein. The guide bar 51a may comprise a plurality of guide bars so that the guide bars can efficiently support the circumferential surface of the valve unit 60.

In the present invention, the valve unit 60 may include a first plunger 61 and a second plunger 63 that are placed at opposed positions, and a spring 65 placed between the first and second plungers 61 and 63, as shown in the enlarged view occupying the upper section in FIG. 4.

As shown in the enlarged view, the valve unit 60 is fitted in a fork 71 of the shift member 70 that will be described later herein. The valve unit 60 opens or closes the first valve seat V1 and the second valve seat V2. Here, the first plunger 61 and the second plunger 63 of the valve unit 60 are elastically biased by the spring 65, so the first plunger 61 and the second plunger 63 normally close the first valve seat V1 and the second valve seat V2, respectively.

Here, as shown in the enlarged view, each of the first and second plungers 61 and 63 may include: a plunger body 61a, 63a that receives a part of the spring 65 therein; and a rubber plug 61b, 63b that is fastened to an end of an associated plunger body 61a, 63a and closes an associated one of the first and second valve seats V1 and V2. As shown in the enlarged view, the rubber plugs 61b and 63b may be fastened to the respective plunger bodies 61a and 63a through fitting, or may be fastened to the respective plunger bodies 61a and 63a through bonding.

In the present invention, when the first plunger 61 and the second plunger 63 of the valve unit 60 are moved, the outer circumferential surfaces of the plungers 61 and 63 are guided by the guide bar 51a, as shown in the enlarged view of FIG. 4. Here, as shown in the enlarged view, the guide bar 51a may be formed as a single body integrated with the casing 52, or may be mounted to the casing 52 using a locking pin or a locking bolt.

The piezoelectric element 80 is an element that is horizontally installed in the casing 52 and is configured such that a first end of the element 80 bends by voltage applied from the circuit board 59, so that the element 80 moves the valve unit 60. As shown in FIG. 4, the piezoelectric element 80 is installed in the casing 52 of the valve body 50 in such a way that the element 80 forms a cantilever structure, in which the first end and the second end of the piezoelectric element 80 form a free end and a fastened end, respectively.

Figure 5:
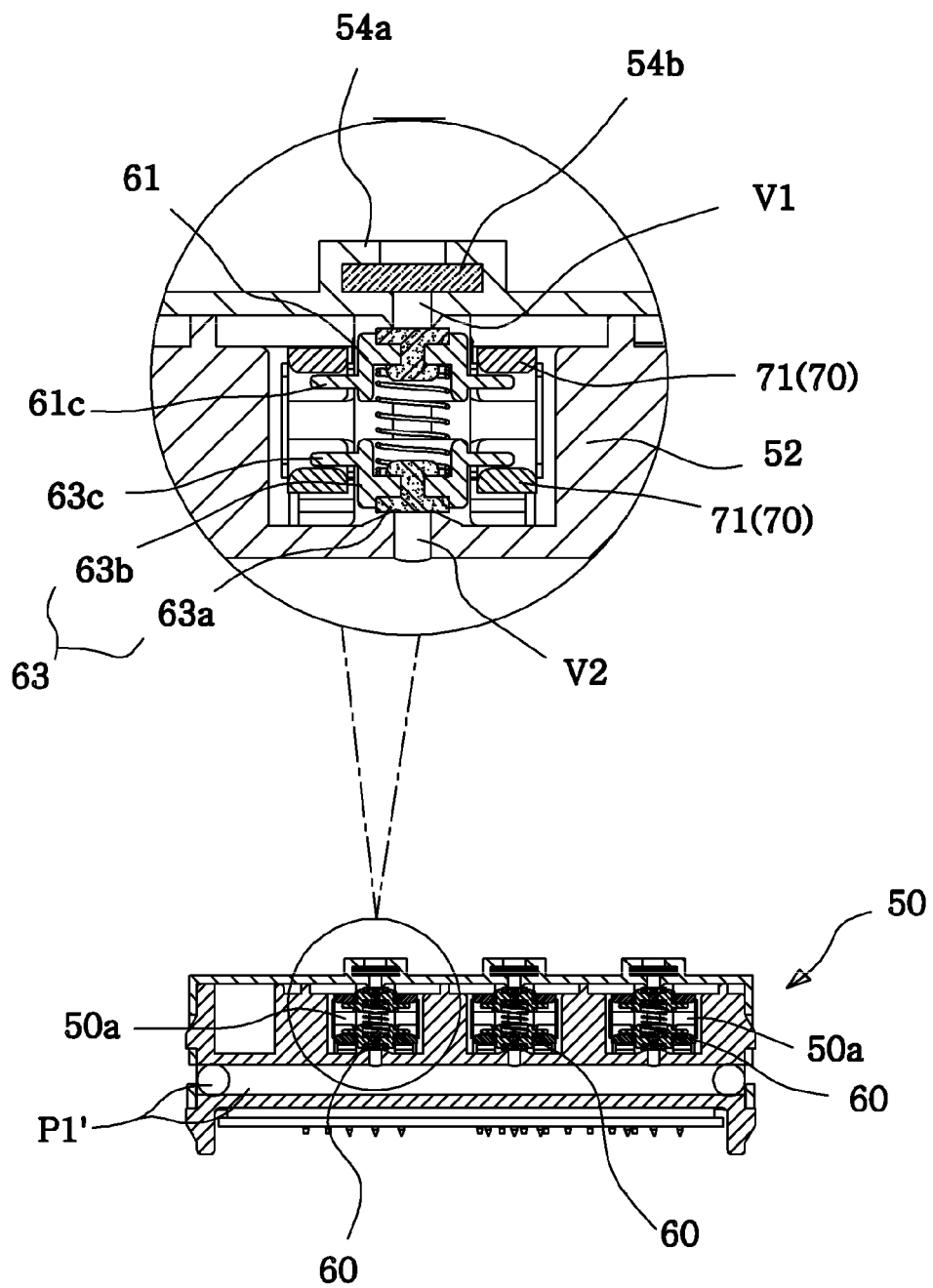
FIG. 5 is a longitudinal sectional view of the piezoelectric valve according to the present invention when seeing the piezoelectric valve from a side.

As shown in FIGS. 4 and 5, the piezoelectric element 80 may be provided with the shift member 70 at the first end of the element 80. Here, the shift member 70 is a member that moves the valve unit 60 in response to a bending motion of the piezoelectric element 80. As shown in the drawing, the shift member 70 may be configured as the fork 71 that is integrated with the first end of the piezoelectric element 80, with the valve unit 60 received in the central portion of the fork 71.

Here, as shown in FIG. 5, the fork 71 is provided with a connection part that is detachably connected to the first and second plungers 61 and 63. For example, the connection part may be configured as locking protrusions 61c and 63c that are flanges formed on the first and second plungers 61 and 63, as shown in FIG. 5. When the valve unit 60 is set in the shift member 70, the locking protrusions 61c and 63c are caught by the fork 71 of the shift member 70. Accordingly, the locking protrusions 61c and 63c not only prevent unexpected removal of the first and second plungers 61 and 63 from the fork 71 of the shift member 70, but also removably connect the first and second plungers 61 and 63 to the fork 71.

Here, both the shift member 70 and the connection part may be omitted from the piezoelectric valve of this invention according to a configuration of the valve unit 60. For example, when the valve unit 60 is configured such that the unit 60 is directly moved by the piezoelectric element 80, both the shift member 70 and the connection part may be omitted.

The insulation stick 91 may be made of an insulating material, for example, a plastic material. As shown in the circled enlarged view occupying the lower section in FIG. 4, the insulation stick 91 may be integrated with the second end of the piezoelectric element 80, and protects the second end of the piezoelectric element 80 in an insulating state. As will be described in detail later herein, the insulation stick 91 is combined with the adjustment bolt 93 that is rotatably held in the casing 52 of the valve body 50, so the insulation stick 91 can firmly hold the second end of the piezoelectric element 80 on the adjustment bolt 93. Here, because the insulation stick is firmly held on the adjustment bolt 93, both the insulation stick 91 and the adjustment bolt 93 can firmly hold the piezoelectric element 80 in the casing 52 of the valve body 50, as shown in the drawing, so the second end of the piezoelectric element 80 is prevented from unexpectedly moving.

As shown in the enlarged view occupying the lower section in FIG. 4, the adjustment bolt 93 is rotatably combined with the casing 52 of the valve body 50, with the insulation stick 91 fitted over the adjustment bolt 93.

The elastic body 95 is an element that elastically supports the insulation stick 91. For example, the elastic body 95 may be configured as a plate spring, as shown in FIG. 4. Unlike this embodiment shown in FIG. 4, the elastic body 95 may be configured as a coil spring fitted over the adjustment bolt 93. The elastic body 95 elastically supports a predetermined part (lower part) of the insulation stick 91, as shown in the drawing, so that the second end of the piezoelectric element 80 may be moved. In other words, the elastic body 95 elastically supports the second end of the piezoelectric element 80 via the insulation stick 91. Because the second end of the piezoelectric element 80 is elastically supported by the elastic body 95 as described above, the piezoelectric element 80 is movably held in the casing 52.

As shown in the enlarged drawing of FIG. 4, the adjustment nut 97 is engaged to the adjustment bolt 93 at a location opposite to the elastic body 95, so the adjustment nut 97 can compresses the insulation stick 91 by being moved along the length of the adjustment bolt 93. Thus, the adjustment nut 97 can adjust the fastened position of the piezoelectric element 80, and can adjust the height of the valve unit 60, so it is possible to control the flow rate of compressed air flowing through the valve seats V1 and V2.

The adjuster 10 is an element that holds the adjustment nut 97 in the valve body 50 in such a way that the adjustment nut 97 is movable while being prevented from rotating, so the adjuster 10 can control the compression force acting on the insulation stick 91 by moving the adjustment nut 97 in response to a pivot rotation of the adjustment bolt 93. For example, the adjuster 10 may be configured as a nut holder 11, as shown in FIG. 4.

The nut holder 11 is configured as a cap-shaped structure formed in the cover 54 constituting the valve body 50, as shown in the enlarged view occupying the lower section in FIG. 4. Thus, when the adjustment nut 97 is received in the nut holder 11, the outer circumferential surface of the adjustment nut 97 comes into close contact with a close contact surface formed on the inner circumferential surface of the nut holder 11, so the adjustment nut 97 is prevented from rotating. Here, as shown in the enlarged view occupying the lower section in FIG. 4, the nut holder 11 has a depth d1 greater than the height h1 of the adjustment nut 97, thereby forming a moving space for allowing a movement of the adjustment nut 97.

Here, to increase the size of the moving space of the nut holder 11 for allowing a movement of the adjustment nut 97 in the valve body 50, the nut holder 11 having the cap-shaped structure protrudes from the upper surface of the cover 54, and forms a depressed shape on the inside surface of the cover 54, as shown in FIG. 4.

Further, as shown in FIG. 4, the valve body 50 may further include a spacer that spaces the head of the adjustment bolt 93 apart from the surface of the casing 52.

The spacer may be configured as a boss 13, as shown in FIG. 4. Here, the boss 13 protrudes from a part of the valve body 50 at which the head of the adjustment bolt 93 is placed, with a threaded shaft of the adjustment bolt 93 passing the boss 13. The boss 13 prevents the head of the adjustment bolt 93 from coming into close contact with the surface of the valve body 50, so the boss 13 reduces friction coefficient during a rotation of the adjustment bolt 93 and allows the adjustment bolt 93 to efficiently rotate. Further, to minimize friction coefficient between the boss 13 and the head of the adjustment bolt 93, the diameter of the boss 13 may be smaller than the diameter of the head of the adjustment bolt 93.

Unlike this embodiment, the spacer may be configured as an embossment (not shown) that protrudes from the surface of the valve body with which the head of the adjustment bolt 93 comes into close contact. To minimize friction coefficient between the boss 13 and the head of the adjustment bolt 93, the embossment may be shaped to have a convex appearance, so the embossment comes into point contact with the surface of the adjustment bolt 93. The spacer spaces the head of the adjustment bolt 93 apart from the surface of the valve body 50 by supporting the head of the adjustment bolt 93 in at least two directions. Accordingly, the spacer can reduce friction coefficient between the head of the adjustment bolt 93 and the valve body 50.

Due to the above-mentioned spacer, the head of the adjustment bolt 93 is exposed outside the valve body 50 with reduced friction coefficient, so a user can easily make a pivot rotation of the adjustment bolt 93 by manipulating the exposed head of the adjustment bolt 93. During a pivot rotation of the adjustment bolt 93, the adjustment nut 97 is moved along the length of the adjustment bolt 93. Accordingly, the adjustment nut 97 compresses the insulation stick 91 and adjusts the fastened position of the piezoelectric element 80.

Described in detail, during a pivot rotation of the adjustment bolt 93, the adjustment nut 97 may be moved downward along the length of the adjustment bolt 93. In this case, the adjustment nut 97 compresses the insulation stick 91 and moves the fastened position of the piezoelectric element 80 downward. However, during an opposite directional pivot rotation of the adjustment bolt 93, the adjustment nut 97 may be moved upward along the length of the adjustment bolt 93. In this case, the adjustment nut 97 allows the insulation stick 91 elastically supported by the elastic body 95 to be moved upward, so the fastened position of the piezoelectric element 80 is moved upward.

Accordingly, in the piezoelectric valve of the present invention, it is possible to adjust the fastened position of the piezoelectric element 80 after assembling the cover 54 with the casing 52, so the valve can control the flow rate of compressed air by changing the height of the valve unit 60.

Further, the insulation stick 91 may be provided with a dispersing part that can disperse the compression force of a stopper to the outside. As shown in the enlarged view of FIG. 4, the dispersing part may be configured as a depressed step ST-1 that is formed on the insulation stick 91 at a position surrounding the adjustment bolt 93.

As shown in the enlarged view of FIG. 4, the dispersing part may further include a seat plate 99*a* that is layered on the insulation stick 91 and is seated on the surface of a part outside the depressed step ST-1. The seat plate 99*a* may be configured as a washer that is fitted over the adjustment bolt and is seated on the surface of the part outside the depressed step ST-1.

Further, the insulation stick 91 may be provided with a concentrating part that concentrates a biasing force of the elastic body 95 to the inside. For example, the concentrating part may be configured as a protruding step ST-2 that protrudes on the insulation stick 91 at a location surrounding the adjustment bolt 93, as shown in the enlarged view of FIG. 4. The concentrating part may further include a seat plate 99*a* that is layered on the insulation stick 91 and is seated on the surface of the protruding step ST-2. Here, the seat plate 99*a* may be configured as a washer that is fitted over the adjustment bolt 93 and is seated on the surface of the protruding step ST-2.

Further, a pressure sensor SS is mounted on the circuit board 59, as shown in FIG. 4. Here, the pressure sensor SS mounted on the circuit board 59 is placed outside the internal space 50*a* of the casing 52, as shown in the drawing. However, one end of the pressure sensor SS passes the casing 52 and is inserted into the internal space 50*a* of the casing 52, so the end of the pressure sensor SS is connected to the internal space 50*a*, as shown in the drawing.

Hereinbelow, a method of manufacturing the piezoelectric valve having the above-mentioned construction of the present invention will be described.

As shown in FIG. 6, the method of manufacturing the piezoelectric valve includes: an adjustment bolt setting step S100, an elastic body seating step S200, a piezoelectric element seating step S300, an adjustment nut engaging step S400, a cover mounting step S500, a fluid passing step S600, a piezoelectric element actuating step S700, a flow rate control step S800, and a fluid leakage test step S900.

In the adjustment bolt setting step S100, the threaded shaft of the adjustment bolt 93 is set in the internal space 50*a* of the casing 52 by vertically inserting the threaded shaft of the adjustment bolt 93 into the valve body 50, as shown in FIG. 4.

In the elastic body seating step S200, the elastic body 95 is seated on the threaded shaft of the adjustment bolt 93 set in the casing 52, as shown in FIG. 4.

In the piezoelectric element seating step S300, the piezoelectric element 80 that is combined with the valve unit 60 at the first end and is combined with the insulation stick 91 at the second end is seated on the elastic body 95 by fitting the second end of the piezoelectric element 80 over the threaded shaft of the adjustment bolt 93, as shown in FIG. 4.

In the adjustment nut engaging step S400, the adjustment nut 97 is engaged with the threaded shaft of the adjustment bolt 93, as shown in FIG. 4.

In the cover mounting step S500, the cover 54 having the nut holder 11 on the inside surface is mounted to the casing 52, as shown in FIG. 3, in such a way that the cover 54 can tightly close the internal space 50*a* of the casing 52 and can prevent a rotation of the adjustment nut 97 in the casing 52.

Due to the cover mounting step S500, the adjustment nut 97 is set in the valve body 50 while being prevented from rotating.

In the cover mounting step S500, the cover 54 may be integrated with the casing 52 into a single body by welding the edge of the cover 54 that comes into close contact with the casing 52 of the valve body 50, as shown in FIG. 4, to the casing 52. Here, the edge of the cover 54 may be welded to the casing 52 by thermal welding, ultrasonic welding, or friction welding, so the edge of the cover 54 can be airtightly sealed to the casing 52.

In the fluid passing step S600, compressed air pumped by a pump (not shown) is supplied into the casing 52 via the pump port P1 provided on the valve body 50 closed by the cover 54, and is discharged via the bidirectional port P2 or via the first valve seat V1 formed in the cover 54, thereby causing the compressed air to pass the valve body 50.

In the piezoelectric element actuating step S700, electricity is applied from the circuit board 50 to the piezoelectric element 80, thereby causing the first end of the piezoelectric element 80 to bend by the electricity. In response to the bending motion of the piezoelectric element 80, the valve unit 60 is moved vertically, and opens or closes the first valve seat V1 and the second valve seat V2.

In the flow rate control step S800, the fastened position of the piezoelectric element 80 is adjusted by moving the adjustment nut 97 according to opening ratios of the valve seats V1 and V2 that are formed by the movement of the valve unit 60. Thus, the flow rates of compressed air passing the valve seats V1 and V2 are controlled.

Here, a user makes a pivot rotation of the head of the adjustment bolt 93, so the adjustment nut 97 is moved along the threaded shaft of the adjustment bolt 93 in response to the pivot rotation of the head of the adjustment bolt 93. When the adjustment nut 97 is moved along the threaded shaft of the adjustment bolt 93 as described above, the adjustment nut 97 compresses the insulation stick 91 and adjusts the fastened position of the second end of the piezoelectric element 80, so the position of the valve unit 60 is changed. When the position of the valve unit 60 is changed as described above, the positions of the valve seats V1 and V2 are changed, and the flow rate of the piezoelectric valve is controlled.

In the fluid leakage test step S900, it is determined whether a fluid (compressed air) leaks from the piezoelectric valve while supplying the fluid to the internal space 50*a* of the valve body 50.

Further, in the piezoelectric valve manufacturing method of the present invention, a flow rate test step S930 and a flow rate comparing step S940 may be performed after finishing the fluid leakage test step S900, as shown in FIG. 6.

In the flow rate test step S930, it is determined whether compressed air passes the valve seats V1 and V2 at flow rates controlled at the flow rate control step S800 by actuating the piezoelectric element 80 again while making compressed air pass the internal space 50*a* of the valve body 50 again.

In the flow rate comparing step S940, it is determined whether the flow rates of the valve seats V1 and V2 detected at the flow rate test step S930 are preset reference flow rates. During the flow rate comparing step S940, the detected flow rates of the valve seats V1 and V2 are compared to the preset reference flow rates, as shown in FIG. 6. When it is determined that the detected flow rates of the valve seats V1 and V2 are equal to the preset reference flow rates, the procedure is ended. However, when it is determined that the detected flow rates of the valve seats V1 and V2 do not reach or exceed the preset reference flow rates, the flow rate control step S800 is performed again so as to compensate for the lower or higher flow rates of the valve seats V1 and V2.

The operation of the piezoelectric valve manufactured as described above according to the embodiment of the present invention will be described hereinbelow.

When the piezoelectric element 80 is fastened to the adjustment bolt 93, the piezoelectric element 80 normally maintains a straight linear state as shown in the drawings. In this case, the valve unit 60 closes the first and second valve seats V1 and V2 using the first and second plungers 61 and 63 elastically biased by the spring 65, as shown in FIG. 4. Accordingly, the fluid passes neither the first valve seat V1 nor the second valve seat V2.

However, when voltage is applied from the circuit board 59 to the piezoelectric element 80, the first end of the piezoelectric element 80 bends by the voltage, as shown in the drawing, and moves the shift member 70. In this case, when the fork 71 of the shift member 70 is moved upward, as shown in FIG. 5, the fork 71 moves the second plunger 63 upward using the locking protrusions 61c and 63c, so the second valve seat V2 is opened. Accordingly, compressed air that has been pumped by the pump (not shown) and has been introduced via the port fluid line P1' flows into the internal space 50a via the valve seat V2, as shown in FIG. 4, and is then supplied to an airbag (not shown) installed in the back of a seat via the bidirectional port P2. Here, when the second valve seat V2 is opened as described above, the spring 65 continuously biases the first plunger 61, so the first valve seat V1 is maintained in a closed state.

Further, in the above state, the second end of the piezoelectric element 80 is elastically supported by the elastic body 95 in a fastened state realized by both the adjustment bolt 93 and the adjustment nut 97, so the second end of the piezoelectric element 80 is prevented from being moved.

In this case, when the insulation stick 91 is provided with the depressed step ST-1 on a side thereof, as shown in FIG. 4, the compression force formed by the adjustment nut 97 is transferred to the part of the insulation stick 91 outside of the depressed step ST-1. In other words, the compression force formed by the adjustment nut 97 is applied to outside of the insulation stick 91.

Further, when the insulation stick 91 is provided with the protruding step ST-2 on the other side thereof, as shown in FIG. 4, the biasing force of the elastic body 95 is transferred to the protruding step ST-2. In other words, the biasing force of the elastic body 95 is applied to a central portion of the insulation stick 91.

Here, in the present invention, the compression force may be directly transferred from the stopper and the elastic body 95 to the depressed step ST-1 and the protruding step ST-2, or may be indirectly transferred from the stopper and the elastic body 95 to the depressed step ST-1 and the protruding step ST-2 via the respective seat plates 99, as shown in the drawing.

Further, as shown in the drawings, a compression force is applied to opposite sides of one surface of the insulation stick 91, and a biasing force is applied to a central portion of the other surface of the insulation stick 91, so the insulation stick 91 is firmly supported. In other words, the opposite sides and the central portion of the insulation stick 91 are compressed respectively, so the insulation stick 91 can efficiently resist a bending moment and is firmly fastened. Accordingly, the insulation stick 91 can efficiently prevent an unexpected movement of the second end of the piezoelectric element 80.

If both the compression force and the biasing force are concentrated onto the central portion of the insulation stick 91 or to the opposite sides of the insulation stick 91, the parts of the insulation stick 91 onto which the compression force and the biasing force are concentrated may function as hinges. In this case, the insulation stick 91 may not efficiently resist a bending moment. However, in the embodiment of the present invention, the compression force is applied to the opposite sides of the insulation stick 91 while being dispersed, and the biasing force is concentrated to the central portion between the opposite sides to which the compression force is applied, so no part functioning as a hinge remains in the insulation stick 91.

The reason for configuring the piezoelectric valve of this invention such that the compression force and the biasing force are applied to different positions of the insulation stick 91 is that, because the piezoelectric element 80 is a long element, the piezoelectric element 80 cannot efficiently resist a bending moment. Further, the piezoelectric element 80 is configured such that the first end thereof may bend, so it is required to make the compression force and the biasing force be applied to different positions of the insulation stick 91. In other words, when it is not required to configure the first end of the piezoelectric element 80 to bend, the compression force and the biasing force may not be applied to different positions on the insulation stick 91.

Further, the pressure sensor SS senses a pressure in the internal space 50a by the end of the pressure sensor SS inserted into and connected to the internal space 50a of the casing 52. Due to the pressure sensor SS, the piezoelectric valve according to the embodiment of the present invention can realize precise control for the flow rate for a fluid flowing via the piezoelectric valve.

Further, when the piezoelectric element 80 bends in an opposite direction, the shift member 70 held by the locking protrusions 61c and 63c is moved downward along with the first plunger 61, so the first valve seat V1 is opened. Accordingly, air that has been discharged from the airbag (not shown) into the internal space 50a via the bidirectional port P2 is discharged to the outside of the casing 52 via the opened first valve seat V1. When air is discharged from the internal space 50a to the outside via the opened first valve seat V1, the sound absorbing material 54b can absorb noise generated by the discharge of air. Here, when the first valve seat V1 is opened as described above, the spring 65 continuously biases the second plunger 63, so the second valve seat V2 is maintained in a closed state.

As described above, the piezoelectric valve and the method of manufacturing the piezoelectric valve according to the present invention are advantageous in that in that the adjustment nut 97 is provided in the valve body 50 with the adjuster 10 preventing a rotation of the adjustment nut 97, and can control a compression force acting on the insulation stick 91 by being moved by a rotation of the adjustment bolt 93, so the present invention can control the flow rate of a fluid in the piezoelectric valve by adjusting the fastened position of the piezoelectric element 80 even after assembling the valve body 50, and the present invention can remarkably reduce generation of imperfection in manufactured valves.

Described in detail, in the present invention, the nut holder 11 formed in the valve body 50 provides a moving space for allowing a movement of the adjustment nut 97, in which the outer circumferential surface of the adjustment nut 97 comes into close contact with the inside surface of the nut holder 11. Thus, the adjustment nut 97 can efficiently compress the insulation stick 91 by being moved along the inside surface of the nut holder 11, so the fastened position of the piezoelectric element 80 may be adjusted to a desired position.

Further, because the valve body 50 of the present invention is formed by the casing 52 and the cover 54, the valve body 50 has a simple construction.

Further, the piezoelectric element 80 moves the valve unit 60 using both the shift member 70 and the connection part, so the valve unit 60 and the piezoelectric element 80 may be configured as separated parts. Accordingly, the design of the piezoelectric element 80 or of the valve unit 60 may be freely changed according to a desired flow rate or the characteristics of a fluid flowing in the valve.

Further, in the present invention, the compression force and the biasing force may be dispersed or concentrated by the dispersing part or by the concentrating part, so it is possible to firmly fasten the second end of the piezoelectric element 80. Thus, the present invention can realize a more efficient bending motion of the piezoelectric element 80.

Further, in the present invention, the piezoelectric element 80 can move the valve unit 60 using the shift member 70 and the connection part, so the valve unit 60 and the piezoelectric element 80 may be configured as separated parts. Accordingly, the design of the piezoelectric element 80 or of the valve unit 60 may be freely changed according to characteristics of a flow rate or characteristics of a fluid flowing in the valve.

Further, both the circuit board 59 and the pressure sensor SS are mounted to the valve body 50 while being separated from the internal space 50*a* of the valve body 50, so the present invention can prevent a reduction in the life span of both the circuit board 59 and the pressure sensor SS due to contact with a fluid flowing in the internal space 50*a*. Further, the present invention can measure the pressure inside the internal space 50*a* using the pressure sensor SS, so the present invention can efficiently control the flow rate of a fluid according to the measured pressure.

Further, in the present invention, the first valve seat V1 is provided in the casing 52 of the valve body 50, and the second valve seat V2 is provided in the cover 54, so the valve body 50 may be configured as divided sections. Because the valve body 50 may be configured as divided sections as described above, the construction of the valve body 50 may be freely changed.

Further, in the present invention, the shift member 70 may be configured as a fork 71 having a simple structure, so the shift member 70 may be easily manufactured. Further, the locking protrusions 61*c* and 63*c* of the connection part may be integrally formed with the first and second plungers 61 and 63 into a single body during a process of forming the first and second plungers 61 and 63, so the connection part may be easily and efficiently manufactured.

Further, in the present invention, the guide bar 51*a* guides movement of the first and second plungers 61 and 63, so the guide bar 51*a* can realize efficient movement of the first and second plungers 61 and 63, and can realize precise control for the flow rate of a fluid.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

INDUSTRIAL APPLICABILITY

Although the present invention has been described as being used in a car, as an example, it is noted that the present invention may be used in electronic equipment or machines in which it is required to control the flow of a fluid.

The invention claimed is:

1. A piezoelectric valve openable by voltage, the piezoelectric valve comprising:
 a valve body including: at least one port through which a fluid flows, an internal space communicating with the port, and at least one valve seat through which the fluid flowing through the port flows;
 a valve unit opening or closing the valve seat of the valve body;
 a plate-shaped piezoelectric element horizontally installed in the internal space of the valve body, with the valve unit mounted to a first end of the piezoelectric element;
 an insulation stick integrated with a second end of the piezoelectric element, and protecting the second end of the piezoelectric element in an insulating state;
 an adjustment bolt rotatably held in the valve body, with the insulation stick fitted over the adjustment bolt;
 an elastic body elastically supporting the insulation stick fitted over the adjustment bolt in such a way that the insulation stick is moved along a length of the adjustment bolt;
 an adjustment nut engaged with the adjustment bolt at a location opposite to the elastic body, the adjustment nut compressing the insulation stick while being moved along the length of the adjustment bolt by a pivot rotation of the adjustment bolt, thereby moving both the insulation stick and the second end of the piezoelectric element along the length of the adjustment bolt; and
 an adjuster holding the adjustment nut in the valve body in such a way that the adjustment nut is movable while being prevented from rotating, the adjuster moving the adjustment nut in response to the pivot rotation of the adjustment bolt and controlling a compression force acting on the insulation stick by the adjustment nut,
 wherein the adjuster comprises:
 a nut holder formed in the valve body and having a cap-shaped structure, with a close contact surface formed on an inner circumferential surface of the nut holder and coming into close contact with an outer circumferential surface of the adjustment nut, thereby preventing the adjustment nut from rotating, and with a space defined in the nut holder and having a depth greater than a height of the adjustment nut, thereby forming a moving space for allowing a movement of the adjustment nut.

2. A method of manufacturing a piezoelectric valve, the method comprising:
 an adjustment bolt setting step of setting an adjustment bolt in a valve body that includes at least one port through which a fluid flows, an internal space communicating with the port, and at least one valve seat through which the fluid flowing through the port flows, by vertically inserting a threaded shaft of the adjustment bolt into the valve body such that the threaded shaft of the adjustment bolt is placed in the internal space of the valve body;
 an elastic body seating step of seating an elastic body on the threaded shaft of the adjustment bolt set in the valve body;
 a piezoelectric element seating step of seating a piezoelectric element that is combined with a valve unit at a first end thereof and is combined with an insulation stick at a second end thereof, on the elastic body by fitting the second end of the piezoelectric element over the threaded shaft of the adjustment bolt;
 an adjustment nut engaging step of engaging an adjustment nut with the threaded shaft of the adjustment bolt, thereby assembling the adjustment nut with the adjustment bolt;

a cover mounting step of mounting a cover having a nut holder that holds the adjustment nut in such a way that the adjustment nut is movable while being prevented from rotating, to the valve body so that the cover tightly closes the internal space of the valve body and prevents a rotation of the adjustment nut;

a fluid passing step of passing the fluid through the internal space of the valve body by supplying or discharging the fluid into or from the valve body via the port;

a piezoelectric element actuating step of causing the first end of the piezoelectric element combined with the valve unit to bend by supplying electricity to the piezoelectric element, so that the valve unit opens or closes the valve seat of the valve body;

a flow rate control step of controlling a flow rate of the fluid flowing through the valve seat by moving the adjustment nut along the threaded shaft of the adjustment bolt according to an opening ratio of the valve seat formed by the valve unit; and a fluid leakage test step of determining whether the fluid leaks from the internal space of the valve body while supplying the fluid into the internal space.

3. The method of manufacturing the piezoelectric valve according to claim 2, wherein, in the flow rate control step, a head of the adjustment bolt is rotated so that the adjustment nut is moved along the threaded shaft of the adjustment bolt, thereby moving a fastened position of the second end of the piezoelectric element held by the threaded shaft of the adjustment bolt, and adjusting a position of the valve unit combined with the first end of the piezoelectric element.

4. The method of manufacturing the piezoelectric valve according to claim 2, further comprising:

a flow rate test step of determining the flow rate of the fluid flowing through the valve seat while passing the fluid through the valve body again by supplying or discharging the fluid into or from the internal space of the valve body and while actuating the piezoelectric element when it is determined that the fluid leaks from the internal space of the valve body at the fluid leakage test step; and a flow rate comparing step of comparing the flow rate of the fluid flowing through the valve seat determined at the flow rate test step with a preset reference flow rate, and of adjusting the flow rate again or ending a procedure according to a comparing result.

\* \* \* \* \*